(12) United States Patent
Bruce

(10) Patent No.: US 6,545,490 B1
(45) Date of Patent: Apr. 8, 2003

(54) TRENCH-FILLED PROBE POINT FOR A SEMICONDUCTOR DEVICE

(75) Inventor: Victoria J. Bruce, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/383,782

(22) Filed: Aug. 26, 1999

(51) Int. Cl.⁷ .............................................. G01R 31/26
(52) U.S. Cl. ........................ 324/750; 324/752; 324/765
(58) Field of Search ................................ 324/765, 763, 324/750, 751, 752; 438/14–18, 406, 459; 257/40–48; 204/192.34, 192.13, 192.23, 556

(56) References Cited

U.S. PATENT DOCUMENTS

| 4,628,258 A | | 12/1986 | Lischka |
| 5,006,795 A | | 4/1991 | Yoshikawa et al. |
| 5,804,980 A | * | 9/1998 | Nikawa ........................ 324/752 |
| 5,807,783 A | * | 9/1998 | Gaul et al. ................... 438/406 |
| 5,930,588 A | * | 7/1999 | Paniccia ........................ 438/16 |
| 5,948,217 A | * | 9/1999 | Winer et al. ............. 204/192.34 |
| 6,020,746 A | * | 2/2000 | Livengood ................... 324/754 |

* cited by examiner

Primary Examiner—Vinh P. Nguyen

(57) ABSTRACT

A semiconductor device is manufactured and tested post-manufacture using a probe point extending into the backside of a flip-chip device. During manufacture, a trench is formed in a portion of the backside of the device. At least a portion of the trench is filled with conductive material to provide a probe. After the device is manufactured, circuitry adjacent the probe point is tested. The testing includes milling the backside of the semiconductor device to access the probe, and then coupling energy from the probe to acquire a waveform.

18 Claims, 3 Drawing Sheets

TRENCH-FILLED PROBE POINT FOR A SEMICONDUCTOR DEVICE

RELATED APPLICATIONS

This application is also related to, and fully incorporates by reference, U.S. patent application Ser. No. 09/166,656, entitled "Semiconductor Structure Having Backside Probe Points For Direct Signal Access From Active And Well Regions," filed Oct. 5, 1998, and U.S. Pat. No. 6,255,124, entitled "Endpoint Detection For Thinning A Flip Chip Bonded Integrated Circuit," issued on Jul. 3, 2001.

FIELD OF THE INVENTION

The present invention relates to semiconductor device assemblies, and more particularly, to techniques and apparatuses for analyzing and debugging circuitry associated with an integrated circuit.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second), to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, different chip packaging techniques have been used. One of many related package types is called controlled collapse chip connection or flip chip packaging. This technology uses the bonding pads and metal (solder) bumps. To increase the density of the inputs and outputs, the bonding pads are moved to the site nearest the transistors and other circuit devices formed in the die. As a result, the electrical path to the pad is shorter. Electrical connection to the package is made when the die is flipped over the package with corresponding bonding pads. Each bump connects to a corresponding package inner lead. The resulting packages have a lower profile, a lower electrical resistance and a shortened electrical path. The output terminals of the package may be ball-shaped conductive-bump contacts (usually solder, or other similar conductive material) are typically disposed in a rectangular array. These packages are occasionally referred to as "Ball Grid Array" (BGA). Alternatively, the output terminals of the package may be pins, and such a package is commonly known as pin grid array (PGA).

For BGA, PGA and other types of packages, once the die is attached to the package, the backside portion of the die remains exposed. The transistors and other circuitry are generally formed in a very thin epitaxially grown silicon layer on a single crystal silicon wafer of which the die is singulated from. The side of the die including the epitaxial layer containing the transistors, and the other active circuitry, is often referred to as the circuit side of the die or front side of the die. The circuit side of the die is positioned very near the package. The circuit side opposes the backside of the die. Between the backside and the circuit side of the die is single crystalline silicon. The positioning of the circuit side provides many of the advantages of the flip chip.

In some instances the orientation of the die with the circuit side face down on a substrate may be a disadvantage or present new challenges. For example, when a circuit fails or when it is necessary to modify a particular chip, access to the transistors and circuitry near the circuit side is typically obtained only from the backside of the chip. This is challenging since the transistors are in a very thin layer (about 10 micrometers) of silicon buried under the bulk silicon (greater than 500 micrometers). Thus, the circuit side of the flip chip die is not visible or accessible for viewing using optical or scanning electron microscopy.

Techniques have been developed to access the circuit even though the circuit of the integrated circuit (IC) is buried under the bulk silicon. For example, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this means removing at least 625 microns of silicon before IR microscopy can be used.

Thinning the die for failure analysis of a flip chip bonded IC is usually accomplished in two or three steps. The backside of the die is first thinned across the whole surface. This is also referred to as global thinning. Global thinning is done to allow viewing of the active circuit from the backside of the die using IR microscopy. Mechanical polishing is one method for global thinning. Using IR microscopy, an area is identified for accessing to a particular area of the circuit. Local thinning techniques such as laser microchemical etching are used to thin the silicon area to a level that is thinner than the die size. One method for laser microchemical etching of silicon is accomplished by focusing a laser beam on the backside of the silicon surface to cause local melting of silicon in the presence of chlorine gas. The molten silicon reacts very rapidly with chlorine and forms silicon tetrachloride gas, which leaves the molten (reaction) zone. A specific example silicon-removal process uses the 9850 SiliconEtcher™ tool by Revise, Inc. (Burlington, Mass.). This laser process is suitable for both local and global thinning by scanning the laser over a part of, or the whole, die surface.

During failure analysis, or for design debug, it is sometimes helpful to access probe points on the circuit side or front side of the die. Milling through the die to access the node, or milling to the node and subsequently depositing a metal to electrically access the node generally does this. For design debug, it is desirable to have the capability of obtaining a waveform via probe points. For these reasons, it is necessary to have a method and apparatus which will provide for obtaining a waveform on the circuit side of the die. It is also necessary to be able to obtain a waveform without damaging the device or otherwise jeopardizing further device analysis.

Accordingly, flip chip technology would benefit from a method and apparatus for readily accessing a probe point for waveform acquisition within a semiconductor device. This is helpful for reducing any guesswork as to the location of the circuitry while the backside of a die is being removed, improving the ability to maintain the integrity of the device. If this guesswork is reduced or eliminated, failure analysis and debugging of the circuitry associated with a particular integrated circuit is improved. Furthermore, when the probe point is easily found, acquiring a waveform can be accomplished in less time.

SUMMARY OF THE INVENTION

The method and apparatus described herein is directed to manufacturing and post-manufacturing testing of a semiconductor device. In an example embodiment, a semiconductor device manufacture includes forming a trench in a portion of the backside of a semiconductor device having a circuit side and a backside. At least a portion of the trench is filled with conductive material to form a probe point that extends into the backside. After the semiconductor device is manufactured, the semiconductor device is tested by milling the backside of the semiconductor device to access the probe point. Using a test fixture, the semiconductor device is powered and energy coupled from the probe point is acquired to obtain a voltage waveform at the node to which the probe point is coupled. In a more specific approach, e-beam microscopy is used to detect the waveform at the probe point. In certain implementations, the probe point is capacitively coupled to the node, and in other implementations, the probe point is directly connected to the target node.

In another implementation, the present invention is directed to voltage waveform acquisition from a first target node by charging a second target node via its associated probe point. An electron beam detector is used to acquire a voltage waveform from the probe point that is coupled to another target node. In this implementation, the target nodes are selected such that a certain response from the first target node is predicted in response to an applied charge at the second target node.

The above summary is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
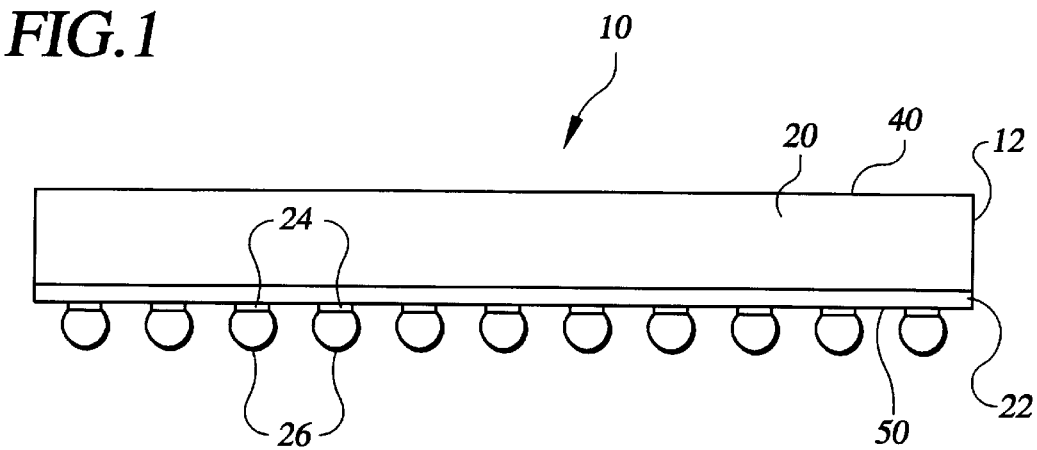
FIG. 1 shows an example side view of a flip chip packaged integrated circuit, consistent with an example embodiment of the invention described herein.

While the invention is amenable to various modifications and alternative forms, specifics thereof have been shown by way of example in the drawings and will be described in detail. It should be understood, however, that the intention is not to limit the invention to the particular embodiments described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices that benefit from post-manufacture testing from their backside. The invention has been found to be particularly suited for testing flip-chip type circuit packages. While the present invention is not limited to such package types, an appreciation of various aspects of the invention is best gained through a discussion using this type of application.

FIG. 1 shows a side view 10 of a flip chip type die 12, according to an example embodiment of the present invention. Flip chip die 12 has a circuit side 50 and a backside 40. A number of circuit devices are formed near the circuit side in a portion of the die referred to as the epitaxial layer 22. The epitaxial layer 22 has a thickness in the range of 1 to 15 microns. The portion of the die shown above the epitaxial layer will be referred to as the bulk silicon layer 20.

A plurality of solder bumps 26 are made on the circuit side 50 at pads 24. The solder bumps 26 are the inputs and outputs to the circuitry associated with the flip chip die 12. The die 12 may be attached to other devices, such as a package for a flip chip, via the solder bumps on the die 12.

Figure 2:
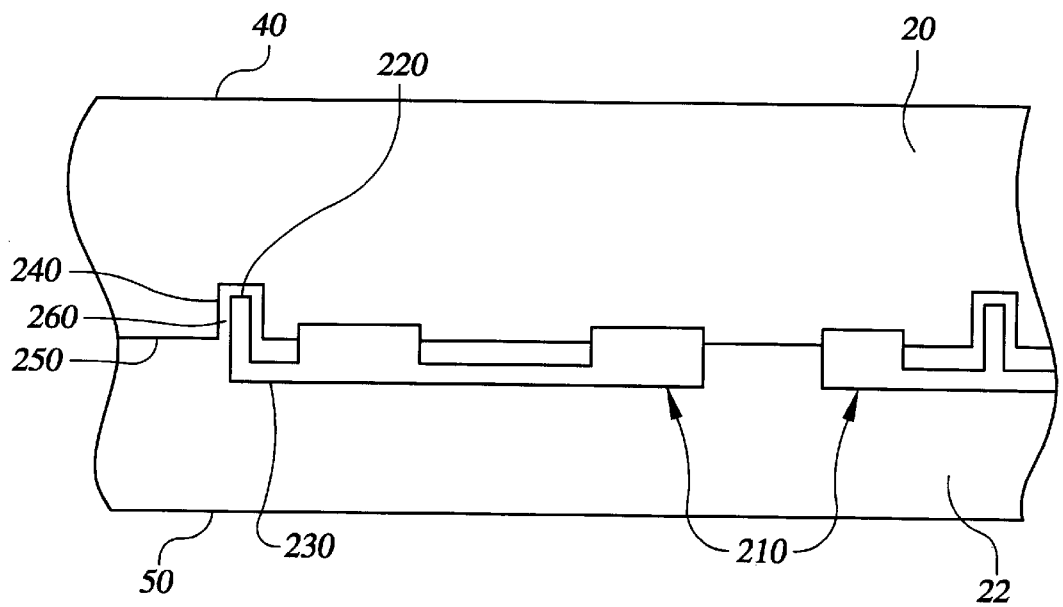
FIG. 2 is an enlarged view of a flip chip die with probe points extending into a layer of the die, according to another example embodiment of the invention.

FIG. 2 shows an enlarged view of a flip chip die with probe points 220 extending from the local interconnect 230, beyond the intersection 250 between the bulk silicon layer 20 and the epitaxial layer 22, and into a trench 240 in the bulk silicon layer 20. In an example embodiment, the trench extends up to several microns into the bulk silicon layer 20. Example representations of circuitry 210 are shown near the circuit side 50 within the epitaxial layer 22.

The trench 240 is formed during the manufacture of the flip chip die. In one implementation, the trench is formed at a depth convenient with other trenches formed in the applicable manufacturing process. The trench is formed using, for example, processes such as deep trenching or STI. An insulative layer 260 may also be formed within the trench. The insulative layer may include, for example, any of various dielectric materials, such as silicon dioxide. After the insulative layer is formed in the trench, conductive material is deposited to form a probe point 220. The conductive material may include, for example, material such as tungsten, cobalt, and titanium. Depending on the desired implementation and the type of circuit to be accessed for testing, the probe point 220 directly contacts a target node (e.g., an active region, a contact or a metal layer), such as interconnect 230, or capacitively couples to the target node.

Figure 3:
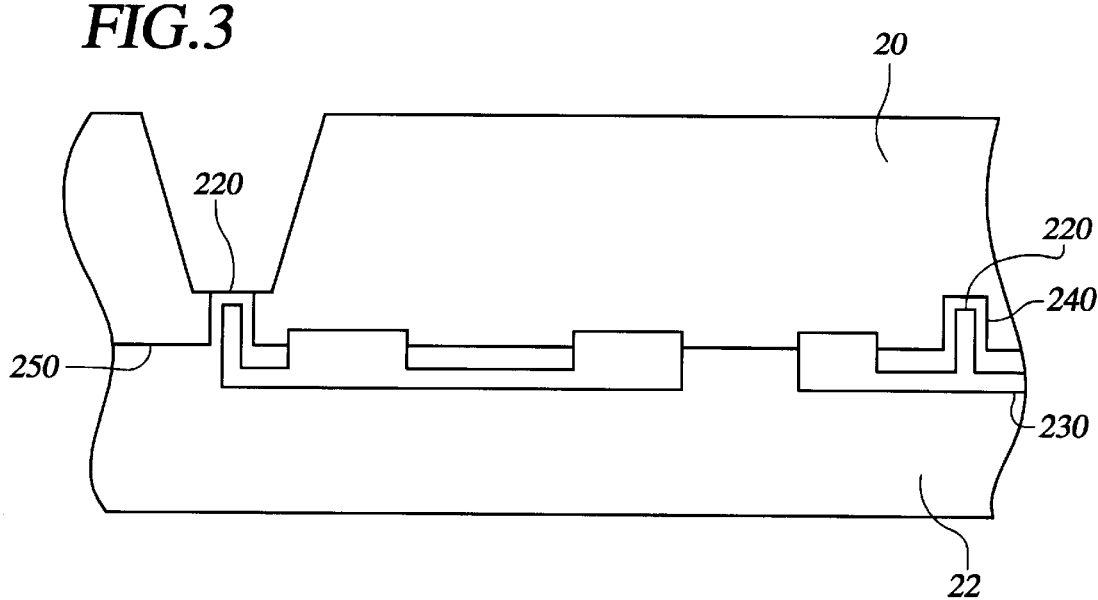
FIG. 3 is an enlarged view of a flip chip die with probe points extending into a layer of the die, wherein a portion of the die has been removed and a probe point has been exposed, according to another example embodiment of the invention.

According to another example embodiment of the present invention, FIG. 3 shows an enlarged view of a flip chip die with probe points 220 extending from the local interconnect 230, beyond the intersection 250 between the bulk silicon layer 20 and the epitaxial layer 22, and into a trench 240 in the bulk silicon layer 20. FIG. 3 further shows an area where part of the bulk silicon layer has been removed and a probe point 220 is exposed. The silicon may be removed, for example, using devices such as a focused ion beam (FIB) or laser etching apparatus.

Figure 4:
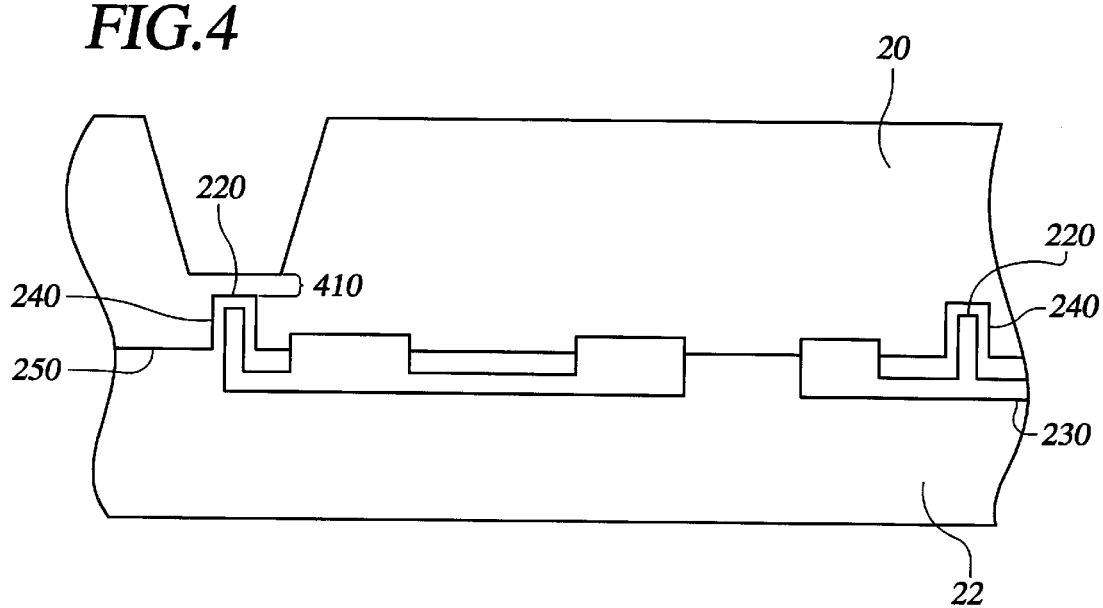
FIG. 4 is an enlarged view of a flip chip die with probe points extending into a layer of the die, wherein a portion of the die has been removed and a thin layer adjacent to a probe point has been exposed, according to another example embodiment of the invention.

FIG. 4 shows an enlarged view of a flip chip die with probe points 220 extending from the local interconnect 230, beyond the intersection 250 between the bulk silicon layer 20 and the epitaxial layer 22, and into a trench 240 in the bulk silicon layer 20, according to an example embodiment of the present invention. FIG. 4 further shows an area where part of the bulk silicon layer has been removed to expose a thin layer 410 adjacent to the trench 240.

Figure 5:
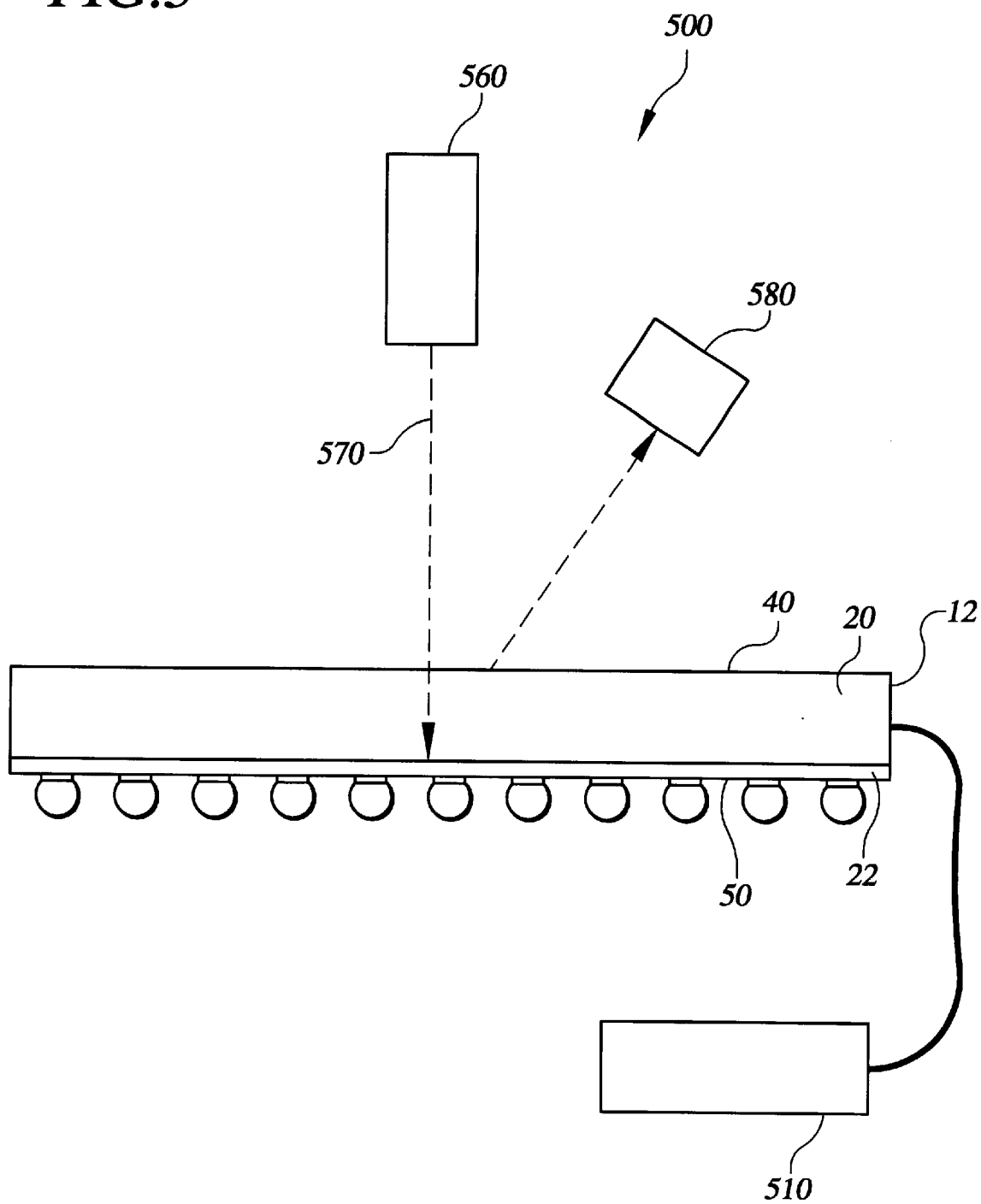
FIG. 5 shows a schematic view of a system for milling and post-manufacturing testing a semiconductor device, according to another example embodiment of the invention.

FIG. 5 shows a schematic view of a system 500 for milling and post-manufacturing testing a semiconductor device, according to another example embodiment of the invention. In one implementation, apparatus 560 is used for removing portions of the die. The apparatus 560 produces a beam 570 which can be used to globally thin the die 12, such as to remove silicon across the entire backside surface 40. The beam 570 may also be used to locally thin a portion of the die 12. A testing apparatus 510 is then used to couple energy from the probe point to acquire waveforms from the electrically coupled target node.

The testing apparatus 510 may include or be coupled to various equipment including, for instance, a conventional electron beam detector 580 that is arranged over the semiconductor device to acquire a voltage waveform from the probe point. In many testing applications, such waveforms are acquired while the chip is powered up and running. In this instance, a test fixture is used to power the chip and to control and monitor input/output signaling. One such test fixture is described in connection with U.S. Pat. No. 6,255,124 issued Jul. 3, 2001 entitled "Endpoint Detection For Thinning A Flip Chip Bonded Integrated Circuit," by Jeff Birdsley, Docket No. AMDA.272PA/TT2346, incorporated herein by reference in its entirety.

In other applications not necessarily involving a test fixture for chip power, a voltage waveform is acquired from the probe point using a charged beam radiation apparatus to charge a first node and an electron beam detector to acquire a voltage waveform from the probe point that is coupled to another target node.

In another implementation of the present invention, during the manufacture of the semiconductor device, multiple probe points are formed for coupling to target nodes, and one of the above testing approaches is used to acquire a waveform from one or more target nodes using the associated probe points.

In a more specific implementation and also in accordance with the present invention, a voltage waveform is acquired from a first target node by charging a second target node via its associated probe point. An electron beam detector is used to acquire a voltage waveform from the probe point that is coupled to another target node. In this implementation, the target nodes are selected such that a certain response from the first target node is predicted in response to an applied charge at the second target node.

For background reference to the implementation and operation of charged beam radiation apparatuses and to electron beam detectors, reference may be made to U.S. Pat. No. 5,006,795, entitled "Charged Beam Radiation Apparatus" (Yoshizawa et al.), and U.S. Pat. No. 4,628,258, entitled "Method and Apparatus for Electrical Testing of Microwired Structures with the Assistance of Particle Probes" (Lischke). These references are incorporated herein by reference in their entirety.

Referring to FIGS. 3, 4, and 5, according to an example embodiment, apparatus 560 is used to mill the silicon layer 20 and access a probe point 220. Apparatus 560 may, for example, include a focused ion beam apparatus, or a laser etching apparatus. An example result of the milling process is shown in FIG. 3, wherein a semiconductor device has been milled and probe point 220 is exposed. FIG. 4 shows an example alternative embodiment, wherein the silicon layer 20 is milled and a thin layer 410 adjacent to the probe point 220 is exposed.

In one example application, after the milling process has exposed a probe point, as shown in FIG. 3, testing apparatus 510 is used to directly couple to the probe point and acquire a waveform. Apparatus 510 may, for example, use electron beam probing.

In another example application, after the milling process has exposed a thin layer adjacent to the trench, as shown in FIG. 4, apparatus 510 is used to indirectly couple to the probe point and acquire a waveform. Apparatus 510 may, for example, use electron beam probing via capacitive or direct coupling to acquire the waveform.

The various embodiments described above are provided by way of illustration only and are not intended to limit the invention. Those skilled in the art will readily recognize various modifications and changes that may be made to the present invention, without strictly following the example embodiments and applications illustrated and described herein. Thus, the present invention is not limited by the example embodiments; rather, the scope of the present invention is set forth in the following claims.

What is claimed is:

1. A method for manufacturing and post-manufacturing testing a semiconductor device having at least two layers including a circuit side and a backside, the method comprising:

forming a trench in a portion of the backside of the semiconductor device;

filling at least a portion of the trench with a conductive material to provide a probe point that extends into the backside; and after the semiconductor device is manufactured, testing circuitry adjacent the probe point by milling the backside of the semiconductor device to access the probe point, and then coupling energy from the probe point to acquire a waveform.

2. The method of claim 1, wherein the conductive material includes at least one of: cobalt, tungsten, or titanium.

3. The method of claim 1, wherein the trench is a deep trench formed with a deep trench isolation process.

4. The method of claim 1, wherein the trench is a shallow trench.

5. The method of claim 4, wherein the steps of forming and filling include forming multiple probe points, each probe point associated with a respective target node, and where testing circuitry and coupling energy from the probe point to acquire a waveform includes detecting an electron beam generated from the probe point to acquire a voltage waveform from a respective probe point, and coupling energy to another respective target node via another one of the multiple probe points.

6. The method of claim 1, further comprising filling at least a portion of the trench with means for insulating.

7. The method of claim 6, wherein coupling energy includes detecting an e-beam from the probe.

8. The method of claim 1, wherein milling the backside of the semiconductor device includes milling via focused ion beam (FIB) milling.

9. The method of claim 1, wherein milling the backside of the semiconductor device includes milling via laser etching.

10. The method of claim 1, wherein milling the backside of the semiconductor device includes globally thinning the device.

11. The method of claim 1, wherein milling the backside of the semiconductor device includes locally thinning a portion of the device.

12. The method of claim 1, wherein milling the backside of the semiconductor device includes exposing the conductive material.

13. The method of claim 12, wherein the waveform is acquired via electron beam probing by directly connecting to the probe point.

14. The method of claim 1, wherein milling the backside of the semiconductor device includes exposing a thin layer adjacent to the trench, and wherein the thin layer includes silicon.

15. The method of claim 14, wherein the waveform is acquired via electron beam probing by capacitive coupling to the probe point.

16. The method of claim 14, wherein the waveform is acquired using optical microscopy.

17. A system for testing a semiconductor device, wherein the semiconductor device has at least two layers including a circuit side and a backside, and wherein the backside has at least one trench having conductive material that forms a probe point for a target node in a portion of the backside, the system comprising:
   means for energizing the target node; and
   means for acquiring a waveform from the target node by detecting electrons emanating via the probe point and the backside.

18. A system, according to claim 17, wherein the means for energizing includes at least one of the following: a test fixture; and a charging-beam apparatus.

* * * * *